US012632620B2

(12) United States Patent
Shinohara et al.

(10) Patent No.: US 12,632,620 B2
(45) Date of Patent: *May 19, 2026

(54) DATA PROCESSING APPARATUS AND NON-TRANSITORY RECORDING MEDIUM

(71) Applicant: SUBARU CORPORATION, Tokyo (JP)

(72) Inventors: Takeru Shinohara, Tokyo (JP); Hajime Oyama, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 177 days.

This patent is subject to a terminal disclaimer.

(21) Appl. No.: 18/691,612

(22) PCT Filed: Oct. 3, 2022

(86) PCT No.: PCT/JP2022/037008
§ 371 (c)(1),
(2) Date: Mar. 13, 2024

(87) PCT Pub. No.: WO2024/075164
PCT Pub. Date: Apr. 11, 2024

(65) Prior Publication Data
US 2025/0131156 A1      Apr. 24, 2025

(51) Int. Cl.
*G06F 30/20*          (2020.01)
(52) U.S. Cl.
CPC .................................... *G06F 30/20* (2020.01)
(58) Field of Classification Search
CPC ............ G06F 30/20; G06F 30/15; G08G 1/00
See application file for complete search history.

(56) References Cited

U.S. PATENT DOCUMENTS

| | | | |
|---|---|---|---|
| 12,299,359 | B1 | 5/2025 | Semple |
| 2017/0073064 | A1 | 3/2017 | Isom |
| 2017/0168500 | A1 | 6/2017 | Bradley |
| 2018/0017467 | A1 | 1/2018 | Hiruta et al. |

(Continued)

FOREIGN PATENT DOCUMENTS

| | | |
|---|---|---|
| JP | 2011-076240 A | 4/2011 |
| JP | 2018-010636 A | 1/2018 |
| JP | 6825634 B2 | 2/2021 |

OTHER PUBLICATIONS

International Search Report received in PCT Application No. PCT/JP2022/037009, dated Dec. 20, 2022.

(Continued)

*Primary Examiner* — Anne Marie Antonucci
*Assistant Examiner* — Patrick Daniel Mohl
(74) *Attorney, Agent, or Firm* — Rimon P.C.

(57)          ABSTRACT

A data processing apparatus performs a simulation process based on driving operation data of a vehicle. In the simulation process, the apparatus simulates a vehicle behavior using multiple vehicle models having different parameter settings. The data processing apparatus also performs a model identifying process. In the model identifying process, the apparatus evaluates a similarity between a vehicle behavior obtained by the simulation using each vehicle model and an actual measured vehicle behavior of the vehicle. The apparatus identifies one or more vehicle models that satisfy a predetermined similarity condition based on the evaluated similarity.

7 Claims, 6 Drawing Sheets

(56) References Cited

U.S. PATENT DOCUMENTS

| | | | |
|---|---|---|---|
| 2018/0257683 A1 | 9/2018 | Govindappa | |
| 2018/0268624 A1 | 9/2018 | Remboski | |
| 2020/0105072 A1 | 4/2020 | Wisley | |
| 2021/0286925 A1 | 9/2021 | Wyrvvas | |
| 2023/0112050 A1 | 4/2023 | Askeland | |
| 2023/0194281 A1 | 6/2023 | Lane | |
| 2024/0232460 A1 * | 7/2024 | Cruz | G06F 30/15 |
| 2025/0315726 A1 | 10/2025 | Ishii | |

OTHER PUBLICATIONS

International Search Report received in PCT Application No. PCT/JP2022/037008, dated Dec. 20, 2022.

* cited by examiner

[ FIG. 1 ]
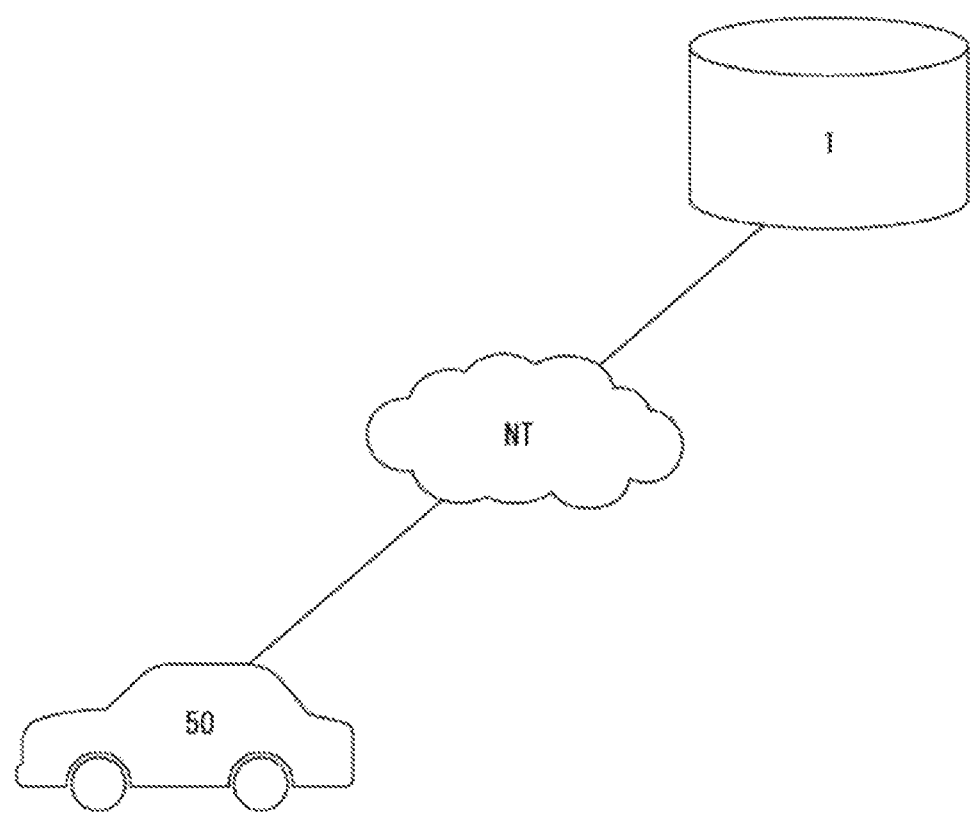

[ FIG. 2 ]
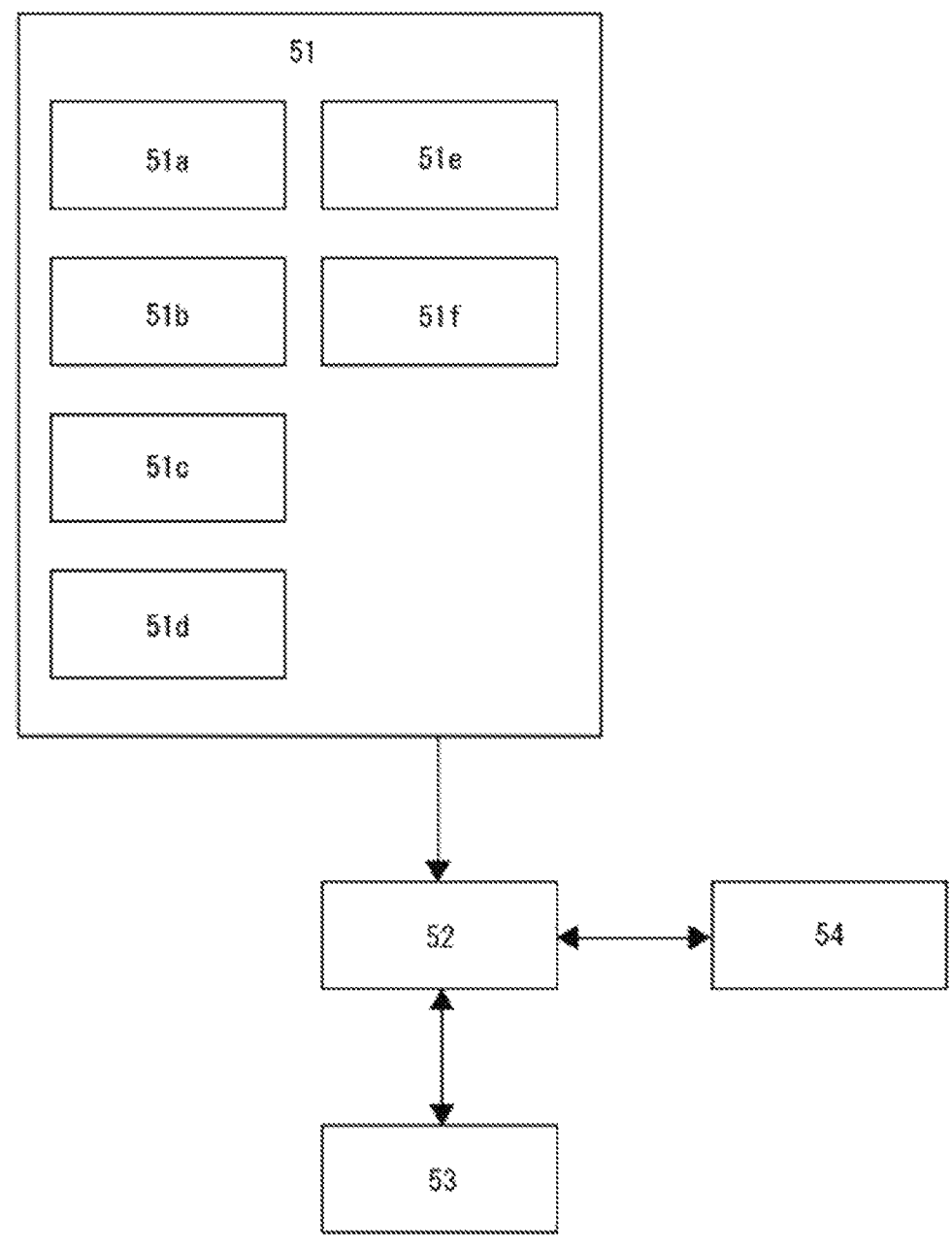

[ FIG. 3 ]
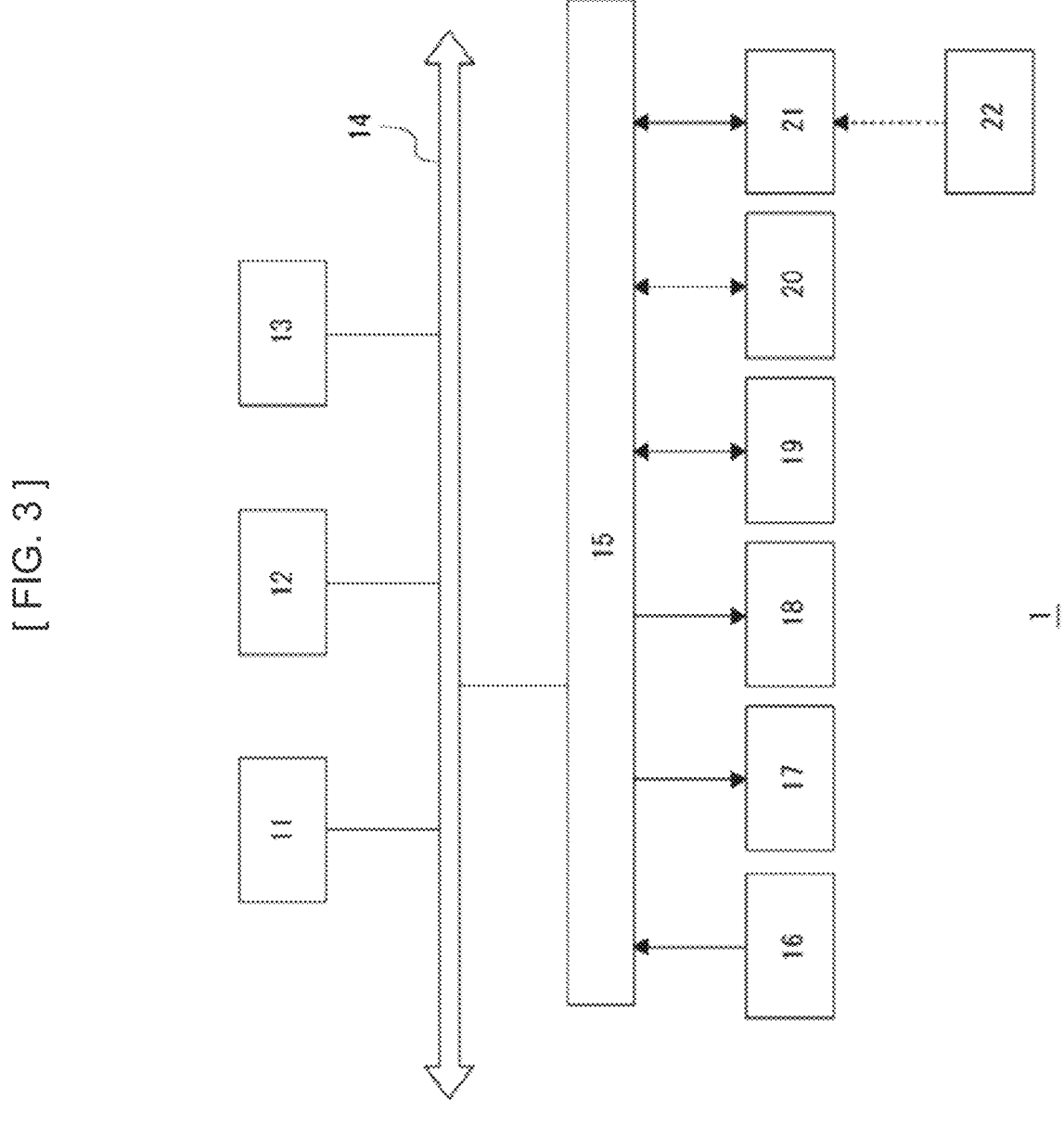

[ FIG. 4 ]
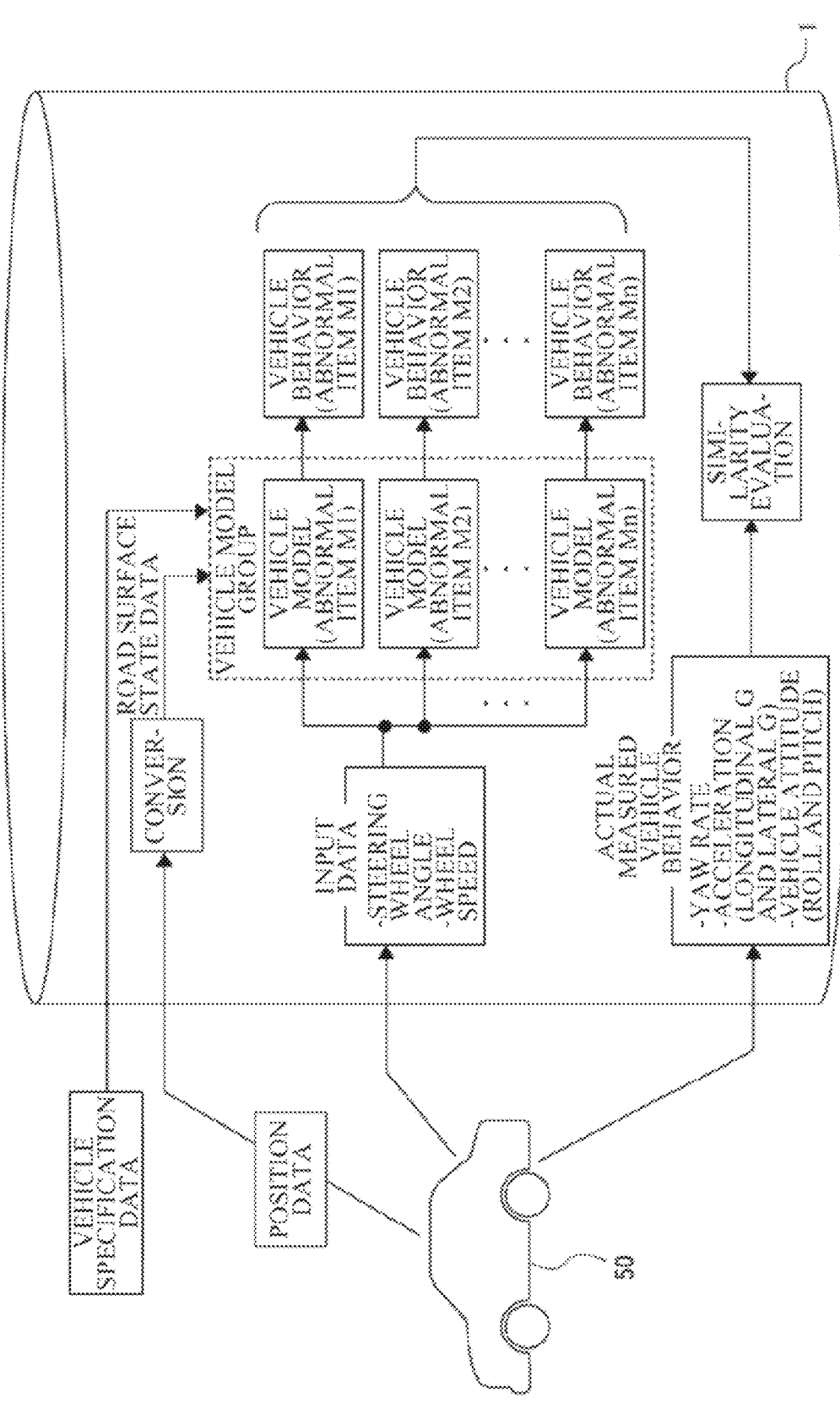

[ FIG. 5 ]
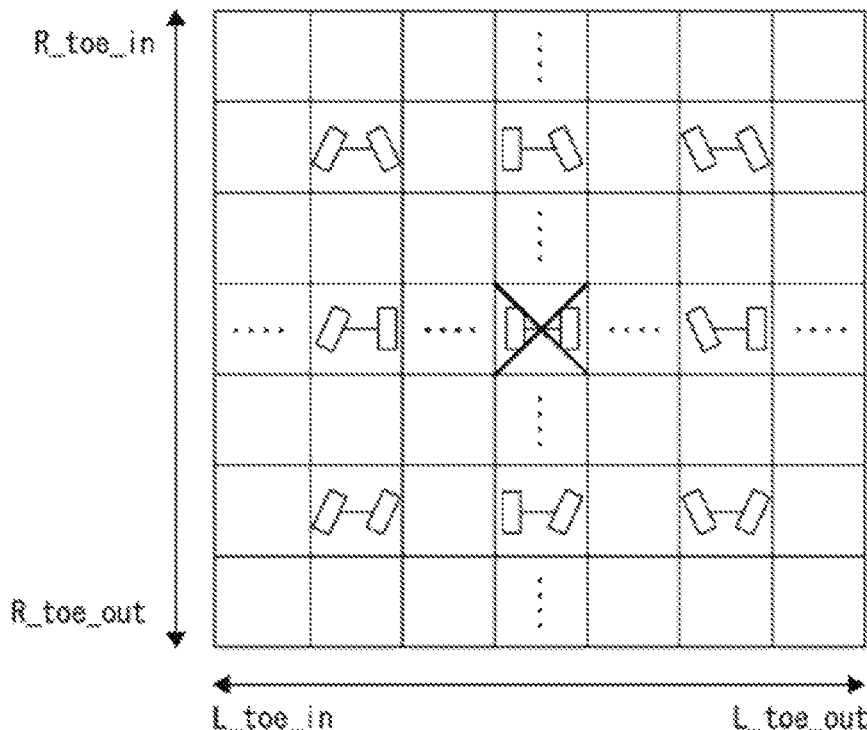

[ FIG. 6 ]
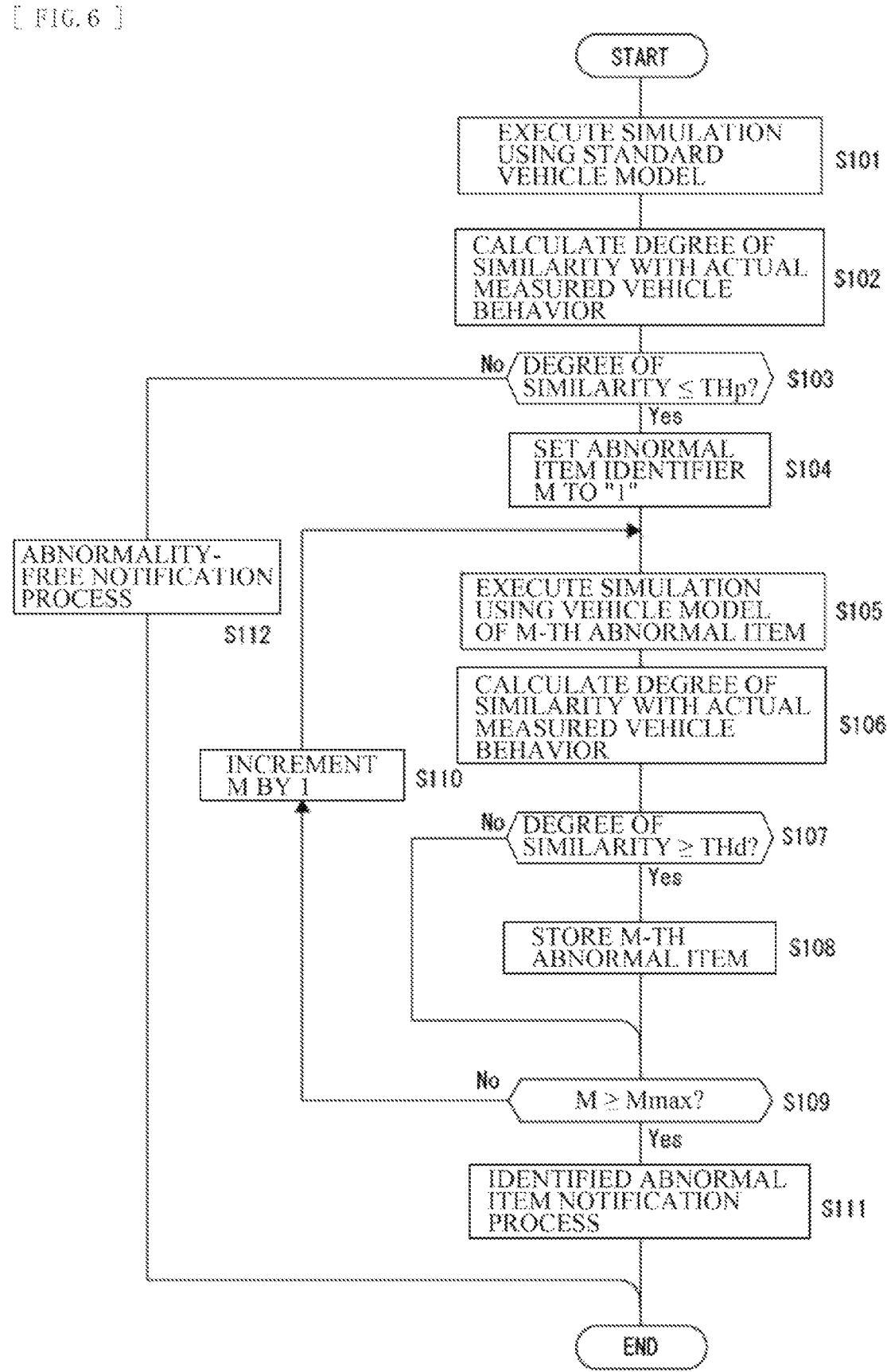

DATA PROCESSING APPARATUS AND NON-TRANSITORY RECORDING MEDIUM

CROSS-REFERENCE TO RELATED APPLICATIONS

This application is the U.S. National Phase under 35 U.S.C. § 371 of International Application No. PCT/JP2022/037008, filed on Oct. 3, 2022.

TECHNICAL FIELD

The invention relates to a data processing apparatus and a non-transitory recording medium, and more particularly, to a technical field of simulating a vehicle behavior using a vehicle model.

BACKGROUND ART

Patent Literature 1 discloses a technique of predicting an occurrence of a malfunction, that is, predicting a malfunction of a component included in a vehicle that may occur at a future time, based on a result of a simulation of a vehicle behavior resulting from traveling of a digital twin vehicle on a server in a traveling environment reproduced in a virtual space. Predicting the malfunction makes it possible to streamline a vehicle maintenance service and prevent an accident caused by the malfunction from occurring.

CITATION LIST

Patent Literature

Patent Literature 1: Japanese Patent No. 6825634

SUMMARY OF INVENTION

Problem to be Solved by the Invention

Here, in order to identify an item of abnormality generated in a vehicle (hereinafter referred to as an "abnormal item") such as a malfunction location of the vehicle, a work staff inspects the vehicle in a maintenance plant, for example.

However, performing such an inspection can lead to an increase in human work burden, which is undesirable. For example, it can be difficult to identify a location where the abnormality has occurred depending on a kind of the abnormality that has occurred, and in such a case, a work burden for identifying the abnormal item increases. Estimation of a degree of occurrence of the abnormality can also be required depending on the kind of the abnormality; however, the estimation of the degree of occurrence of the abnormality in addition to the presence or absence of the occurrence of the abnormality during the inspection leads to an increase in work burden.

The invention has been made in view of the above circumstances, and an object thereof is to reduce a work burden related to identifying an abnormal item of a vehicle.

Means for Solving the Problem

A data processing apparatus according to the invention includes one or more processors, and one or more storage media having a program to be executed by the one or more processors stored therein. The program includes one or more commands. The one or more commands cause the one or more processors to execute: a simulation process of performing, based on driving operation data of a vehicle, a simulation of a vehicle behavior using multiple vehicle models having different parameter settings; and a model identifying process of evaluating a similarity of a vehicle behavior of each of the vehicle models to be obtained in the simulation process with an actual measured vehicle behavior, the actual measured vehicle behavior being a vehicle behavior of the vehicle that has been actually measured, and identifying the vehicle model that satisfies a predetermined similarity condition.

A non-transitory computer readable recording medium according to the invention contains a computer program. The computer program causes, when executed by a computer, the computer to execute a process comprising: a simulation process of performing, based on driving operation data of a vehicle to be a target, a simulation of a vehicle behavior using multiple vehicle models having different parameter settings; and a model identifying process of evaluating a similarity of a vehicle behavior of each of the vehicle models to be obtained in the simulation process with an actual measured vehicle behavior that is a behavior of the vehicle that has been actually measured, and identifying the vehicle model that satisfies a predetermined similarity condition.

Effects of the Invention

According to the invention, it is possible to reduce a work burden related to identifying an abnormal item of a vehicle.

BRIEF DESCRIPTION OF DRAWINGS

FIG. 1 is a diagram illustrating a configuration outline of a data processing system including a data processing apparatus according to an embodiment of the invention.

FIG. 2 is a block diagram illustrating a configuration example of a vehicle according to an embodiment.

FIG. 3 is a block diagram illustrating a configuration example of a data processing apparatus according to an embodiment.

FIG. 4 is a diagram for describing an abnormal item identifying method according to an embodiment.

FIG. 5 is a diagram illustrating a classification example of an abnormal item related to toe angles of wheels.

FIG. 6 is a flowchart illustrating an example of a procedure for achieving an abnormal item identifying method according to an embodiment.

MODES FOR CARRYING OUT THE INVENTION

1. System Configuration

In the following, some embodiments of the disclosure are described with reference to the accompanying drawings.

FIG. 1 is a diagram illustrating a configuration outline of a data processing system including a data processing apparatus according to an embodiment of the invention.

The data processing system includes at least a server apparatus 1 and a vehicle 50. The server apparatus 1 serves as the data processing apparatus in one embodiment of the invention, and includes a computer apparatus including a CPU.

The vehicle 50 includes, for example, a four-wheel vehicle, and configured to travel using an engine or a motor as a drive source. The vehicle 50 according to the embodiment is provided with a computer apparatus configured to communicate with an external apparatus.

In this example, the vehicle 50 is configured to perform data communication with the server apparatus 1 via a network NT serving as a communication network such as the Internet. This allows the vehicle 50 to enter, into the server apparatus 1, various kinds of data such as driving operation data that is data indicating a driving operation on the vehicle 50 or vehicle behavior data that is data indicating a behavior of the vehicle 50 corresponding to the driving operation.

Here, the entering of the data from the vehicle 50 into the server apparatus 1 may also be performed by means other than communication via the network NT. For example, it is conceivable that the vehicle 50 and the server apparatus 1 are coupled to each other via a wired connection, and wired communication is performed to enter target data such as the driving operation data or the vehicle behavior data into the server apparatus 1 from the vehicle 50. Alternatively, it is also conceivable to use a method of entering the target data such as the driving operation data or the vehicle behavior data stored in the vehicle 50 into the server apparatus 1 via a removable recording medium such as a USB (Universal Serial Bus) memory. In addition, it is also conceivable to use a method in which the target data stored in the vehicle 50 is transferred to a computer apparatus, examples of which include a smartphone and a PC (personal computer), of a user such as a driver, following which the target data is entered into the server apparatus 1 from the computer apparatus via the network NT.

As described above, various methods of entering the data from the vehicle 50 into the server apparatus 1 are conceivable, and the invention is not limited to a specific method.

FIG. 2 is a block diagram illustrating a configuration example of the vehicle 50. Note that, in FIG. 2, only electric components according to the embodiment are extracted and illustrated out of components included in the vehicle 50.

As illustrated in the figure, the vehicle 50 includes a sensor unit 51, a controller 52, a memory 53, and a communicator 54.

The sensor unit 51 comprehensively illustrates various sensors included in the vehicle 50, particularly those related to the embodiment.

As illustrated in the figure, the sensor unit 51 includes a yaw rate sensor 51a, an acceleration sensor 51b, a vehicle attitude sensor 51c, a GNSS (Global Navigation Satellite System) sensor 51d, a steering wheel angle sensor 51e, and a wheel speed sensor 51f.

The yaw rate sensor 51a detects a yaw rate of the vehicle 50. The acceleration sensor 51b detects an acceleration (G) acting in a certain direction of the vehicle 50, and, in the embodiment, it is possible to detect at least a longitudinal G and a lateral G of the vehicle 50.

The vehicle attitude sensor 51c detects an attitude of the vehicle 50, specifically, an attitude in a roll direction (a roll angle) and an attitude in a pitch direction (a pitch angle).

The GNSS sensor 51d detects a position on the earth of the vehicle 50.

The steering wheel angle sensor 51e detects a turning angle of a steering wheel in the vehicle 50.

The wheel speed sensor 51f detects a revolution speed of the wheels (four wheels in this example) of the vehicle 50.

The controller 52 includes a microcomputer that includes, for example, a CPU (Central Processing Unit), a ROM (Read Only Memory), and a RAM (Random Access Memory), and corresponds to an ECU (Electronic Control Unit) that executes a process according to the embodiment out of various ECUs included in the vehicle 50.

As illustrated in the figure, the controller 52 is coupled to the memory 53 and the communicator 54.

The memory 53 is a nonvolatile storage device such as an HDD (Hard Disk Drive) or an SSD (Solid State Drive), and the communicator 54 is a communication device that performs, for example, network communication or inter-device communication based on a predetermined communication standard with an external apparatus of the vehicle 50 by wire or wirelessly.

The controller 52 is configured to enter data detected by each of the above-described sensors included in the sensor unit 51. Further, the controller 52 is configured to cause the memory 53 to store the data detected by each of the sensors that has been entered or to transmit the data to an external apparatus such as the server apparatus 1 via the communicator 54.

FIG. 3 is a block diagram illustrating a configuration example of the server apparatus 1.

As illustrated in the figure, the server apparatus 1 includes a CPU 11. The CPU 11 includes a signal-processing unit including at least a CPU, and serves as an arithmetic processing unit that executes various kinds of processes.

The CPU 11 executes various processes in accordance with a program stored in a ROM 12 or a program loaded from a storage 19 to a RAM 13. The RAM 13 also stores, as appropriate, data necessary for the CPU 11 to execute various processes.

The CPU 11, the ROM 12, and the RAM 13 are coupled to each other via a bus 14. To the bus 14, an input/output interface (I/F) 15 is also coupled.

An input unit 16 including an operation element and an operation device is coupled to the input/output interface 15. For example, assumed as the input unit 16 are various operating elements and operating devices including, for example, a keyboard, a mouse, a key, a dial, a touch panel, a touch pad, and a remote controller.

A user operation is detected by the input unit 16, and a signal corresponding to the entered operation is interpreted by the CPU 11.

Further, a display 17 and an audio outputting unit 18 are integrally or separately coupled to the input/output interface 15. The display 17 includes a display device configured to display an image, such as a LCD (Liquid Crystal Display) or an organic EL (Electro-Luminescence). The audio outputting unit 18 includes a speaker.

The display 17 is used for various data displays, and includes, for example, a display device provided in a housing of the server apparatus 1 and a separate display device coupled to the server apparatus 1.

The display 17 executes display of, for example, images for various kinds of image processing and moving images to be processed on a display screen, based on a command of the CPU 11. Further, the display 17 performs display of, for example, various operation menus, icons, and messages, that is, a GUI (Graphical User Interface), based on the command of the CPU 11.

The storage 19 including, for example, an HDD and a solid-state memory, or a communicator 20 including a modem may be coupled to the input/output interface 15.

The communicator 20 performs a communication process via a transmission path such as the Internet, wired/wireless communication with various devices, and communication such as bus communication.

Further, a drive 21 is coupled to the input/output interface 15 as necessary, and a removable recording medium 22 such as a magnetic disk, an optical disc, a magneto-optical disk, or a semiconductor memory is appropriately mounted.

The drive 21 makes it possible to read, for example, a data file such as a program to be used in each of the processes from the removable recording medium 22. The read data file is stored in the storage 19, or an image and a sound included in the data file are outputted by the display 17 or the audio outputting unit 18. For example, the computer program read from removable recording medium 22 is installed in the storage 19 as necessary.

The server apparatus 1 having the above-described hardware configuration is configured to install, for example, software to be used for the processes of the embodiment via network communication by the communicator 20 or via the removable recording medium 22. Alternatively, the software may be stored in advance in, for example, the ROM 12 or the storage 19.

The CPU 11 performs the processes based on various programs, thereby executing a data process and a communication process that are necessary for the server apparatus 1 to be described later.

2. Abnormal Item Identifying Method According to Embodiment

Referring to FIG. 4, an abnormal item identifying method according to the embodiment will be described.

In identifying an abnormal item of the vehicle 50 in the embodiment, the server apparatus 1 prepares multiple vehicle models illustrated as a vehicle model group in the figure. The vehicle model here is a vehicle model in a digital twin technique, and means a calculation model configured to reproduce a vehicle behavior with respect to a driving operation.

In the embodiment, prepared as the multiple vehicle models are vehicle models subjected to parameter setting corresponding to different abnormal items out of abnormal items of the vehicle 50. When the number of assumed abnormal items is "n" from an abnormal item M1 to an abnormal item Mn, n-number of vehicle models corresponding to the respective abnormal items are prepared as the vehicle models, as illustrated in the figure.

Here, it is possible that the abnormal items of the vehicle 50 are referred to as kinds of abnormalities occurring in the vehicle 50. It is possible to define the kinds based on the difference in occurrence sites of the abnormalities, such as an abnormality in alignment of the wheels, an abnormality in a brake pad, or an abnormality in a throttle, but the invention is not limited thereto. Even if the occurrence sites of the abnormalities are the same, it is also possible to define the kinds based on: the difference in occurrence modes of the abnormalities (for example, whether the abnormality is an abnormality in a toe angle or an abnormality in a camber angle if alignment of the wheels is abnormal, and whether the abnormality is an abnormality in a response speed or an abnormality in an opening/closing quantity if the throttle is abnormal); or the difference in a degree of abnormality.

As an example, FIG. 5 illustrates a classification example of an abnormal item related to the toe angles of the wheels.

The example illustrated in FIG. 5 classifies the abnormal item of the toe angle by taking into account the difference of toe-in (toe_in) and toe-out (toe_out) between the left and right wheels, and the difference in terms of quantity between the toe-in (toe_in) and the toe-out (toe_out) (the degree of abnormality).

Note that it is not necessary to classify the abnormal item by taking into account the degree of abnormality as described above. Further, it is not necessary to perform the classification based on the difference in occurrence modes for an abnormality of a certain site.

In FIG. 4, for each vehicle model to be used as the vehicle model group, a vehicle specification data for the vehicle 50, that is, a parameter corresponding to data of, for example, a size (such as a total width, a total length, a total height, or a wheelbase) and a weight of the vehicle 50 is set. This allows the vehicle behavior of the vehicle 50 to be appropriately simulated.

Here, in identifying the abnormal item of the vehicle 50, driving operation data of the vehicle 50 is entered into the server apparatus 1 as input data with respect to the vehicle model. As the driving operation data serving as the input data, data of a steering wheel angle and data of a wheel speed are entered from the vehicle 50 into the server apparatus 1 in this example.

The data of the wheel speed is entered as data corresponding to the driving operation as an accelerator operation and a brake operation of the vehicle 50. For the wheel speed, when what is called a two-wheel model is used as the vehicle model, data detected for at least two corresponding wheels may be entered.

This example assumes that the abnormal item is to be identified only for the abnormal item related to steering as the abnormal item. Accordingly, as the driving operation data, only the data of the steering wheel angle is entered together with the data of the wheel speed.

Note that, for example, when the abnormal item related to the acceleration of the vehicle 50 such as a throttle abnormality is to be identified, data indicating an accelerator opening degree or a throttle angle sensor may be included as the input data (the driving operation data). Further, for example, when the abnormal item related to deceleration of the vehicle 50 such as a brake pad abnormality is to be identified, data indicating a depression amount of the brake may be included as the input data.

For the sake of confirmation, the data of the steering wheel angle and the data of the wheel speed that are included in the driving operation data are respectively detected by the steering wheel angle sensor 51e and the wheel speed sensor 51f.

Further, in identifying the abnormal item of the vehicle 50, data of an actual measured vehicle behavior is entered from the vehicle 50 into the server apparatus 1. The actual measured vehicle behavior means a vehicle behavior of the vehicle 50 actually measured in the vehicle 50, and is specifically the vehicle behavior with respect to the driving operation indicated by the driving operation data to be entered into the vehicle model that is actually measured in the vehicle 50.

In this example, examples of the data of the actual measured vehicle behavior to be entered from the vehicle 50 into the server apparatus 1 include, as illustrated in the figure, the yaw rate, the acceleration (the longitudinal G and the lateral G), and the vehicle attitude (the roll and the pitch).

The data of the yaw rate, the data of the acceleration, and the data of the vehicle attitude to be used as the data of the actual measured vehicle behavior are respectively detected by the yaw rate sensor 51a, the acceleration sensor 51b, and the vehicle attitude sensor 51c.

Note that what data is to be used as the data of the actual measured vehicle behavior should be determined according to what abnormal item is to be identified, and is not limited to data exemplified above.

Here, in this example, the server apparatus 1 receives position data of the vehicle 50 that the vehicle 50 detects with use of the GNSS sensor 51d. Specifically, as the position data, data indicating a position of the vehicle 50 is entered. The position of the vehicle 50 is based on when the driving operation indicated by the driving operation data to be entered into the vehicle model is performed.

The server apparatus 1 performs a process of converting the position data into road surface state data indicating a traveling road surface state of the vehicle 50 at a stage prior to executing a simulation with use of each vehicle model. For example, the conversion process may be performed using a database indicating a correspondence relation between the position data and the traveling road surface state.

Thereafter, the server apparatus 1 performs parameter setting corresponding to the road surface state data obtained by the above-described conversion process on each vehicle model.

Accordingly, the simulation of the vehicle behavior based on the driving operation data of the vehicle 50 is performed using the vehicle model subjected to the parameter setting corresponding to the traveling road surface state of the vehicle.

This makes it possible to perform the simulation of the vehicle behavior reflecting an actual traveling road surface state of the vehicle 50, and improve a simulation accuracy of the vehicle behavior using each vehicle model.

As the road surface condition, it is conceivable to distinguish between a wet road surface and a dry road surface, for example. In such a case, it is conceivable to set not only the position data of the vehicle 50 but also a parameter corresponding to a traveling road surface state estimated based on weather data in the position indicated by the position data to each vehicle model.

The server apparatus 1 uses the driving operation data and the data of the actual measured vehicle behavior entered from the vehicle 50 and the multiple vehicle models to identify the abnormal item of the vehicle 50 as follows.

That is, by being provided with the driving operation data as the input data of each vehicle model, the server apparatus 1 simulates the vehicle behavior for each vehicle model (that is, for each abnormal item). A result of the simulation of the vehicle behavior for each abnormal item is thereby obtained as illustrated in the figure.

In this example, each vehicle model is configured to output, as the data indicating the vehicle behavior, data similar to the data of the actual measured vehicle behavior, that is, at least the data of the yaw rate, the acceleration (the longitudinal G and the lateral G), and the vehicle attitude (the roll and the pitch).

Thereafter, the server apparatus 1 performs a process of evaluating a similarity of the vehicle behavior of each vehicle model obtained as described above with the actual measured vehicle behavior, and identifying the vehicle model that satisfies a predetermined similarity condition.

This example uses the data of the yaw rate, the acceleration, and the vehicle attitude out of pieces of data of the vehicle behavior obtained using each vehicle model in evaluating similarity, in correspondence with the use of the data of the yaw rate, the acceleration, and the vehicle attitude as the data of the actual measured vehicle behavior as described above. That is, the kinds of vehicle behavior data to be used for evaluating similarity are matched.

In the embodiment, as the driving operation data and the data of actual measured vehicle behavior, it is assumed that data (time-series sampled data) of a time waveform in a certain period of, for example, several minutes or several tens of seconds, is entered from the vehicle 50 into the server apparatus 1. The server apparatus 1 uses, in evaluating the similarity described above, such data of the time waveform as both the data of the vehicle behavior using each vehicle model and the data of the actual measured vehicle behavior. In other words, the server apparatus 1 in this case evaluates the similarity based on a time waveform of the vehicle behavior obtained in the simulation process using the vehicle model and a time waveform of the actual measured vehicle behavior.

Specifically, the server apparatus 1 in this example calculates, in evaluating the similarly of the simulated vehicle behavior with respect to the actual measured vehicle behavior, a degree of similarity Sv between the two vehicle behaviors. The degree of similarity Sv is calculated, for example, as a sum of correlation values (1 being the largest value=highest correlation) calculated using a cross-correlation function for respective time waveforms of the yaw rates, the longitudinal Gs, the lateral Gs, the roll angles, and the pitch angles of both the simulated vehicle behavior and the actual measured vehicle behavior. In this case, there are five kinds of time waveforms to be evaluated, and thus the maximum value of the degree of similarity Sv is "5".

The server apparatus 1 identifies the vehicle model in which the degree of similarity calculated as described above is greater than or equal to a predetermined threshold THd. In other words, the server apparatus 1 identifies the vehicle model in which the degree of similarity of the vehicle behavior obtained as the result of the simulation with respect to the actual measured vehicle behavior is high. Performing such a process of identifying the vehicle model identifies the abnormal item of the vehicle 50.

In the above description, the degree of similarity Sv is calculated by a common calculation method for each vehicle model (that is, for each abnormal item), but it is conceivable that the degree of similarity Sv may be calculated by a different calculation method depending on the kind of abnormal item. For example, it is conceivable that the weights when summing the correlated values calculated for each time waveform differ depending on, for example, the kind of abnormal item.

Further, the thresholds THd may also be different depending on the kind of abnormal item.

Here, in this example, the server apparatus 1 performs a process of determining the presence or absence of the abnormality using a standard vehicle model of the vehicle 50 (hereinafter referred to as a "standard vehicle model"), prior to executing the process of identifying the abnormal item based on the similarity between the results of the simulation using the multiple vehicle models and the actual measured vehicle behavior as described above.

The standard vehicle model referred to here means a vehicle model subjected to a parameter setting in such a manner as to reproduce the vehicle behavior with respect to the driving operation in the vehicle 50 with no abnormality, such as the vehicle 50 that is a new vehicle, for example. As the standard vehicle model, at least the vehicle model subjected to the parameter setting that differs from the parameter settings corresponding to assumed abnormal items may be used.

As the process of determining the presence or absence of the abnormality using the standard vehicle model, the server apparatus 1 first performs a simulation of the vehicle behavior using the standard vehicle model. Thereafter, the server apparatus 1 determines whether the degree of similarity of the vehicle behavior obtained by the simulation with respect to the actual measured vehicle behavior is less than or equal to a predetermined degree of similarity.

As the degree of similarity in this case, it is conceivable to use a value calculated by a calculation method similar to that of the above-described degree of similarity Sv.

Thereafter, on condition that the degree of similarity with respect to the actual measured vehicle behavior is determined to be less than or equal to the predetermined degree of similarity based on the above-described determination, the server apparatus 1 performs the process of identifying the abnormal item described above, that is, the process of identifying the vehicle model based on the similarity between the results of the simulation using the multiple vehicle models as the vehicle model group and the actual measured vehicle behavior.

Accordingly, when it is determined that the vehicle is free of abnormality, the process of identifying the abnormal item based on the result of the simulation using the multiple vehicle models becomes unnecessary, which makes it possible to improve processing efficiency.

When the abnormal item is identified, the server apparatus 1 performs a process of notifying a notification target such as a user of the identified abnormal item. Further, when the server apparatus 1 determines that the abnormality is absent as a result of the above-described process of determining the presence or absence of the abnormality, the server apparatus 1 performs a process of notifying the notification target of data indicating the absence of the abnormality.

It is conceivable that the notification may be performed via, for example, a computer apparatus such as a smartphone or a PC used by the user of the vehicle 50, or a computer apparatus disposed in a maintenance facility of a dealer, for example. Alternatively, if the vehicle 50 is communicably coupled to the server apparatus 1, it is also conceivable to perform the notification via a display provided in the vehicle 50.

3. Procedure

Referring to a flowchart of FIG. 6, a specific procedure for achieving an abnormal item identifying method according to the embodiment described above will be described.

The process illustrated in FIG. 6 is executed by the CPU 11 of the server apparatus 1 in accordance with a program stored in a predetermined storage device such as the ROM 12 or the storage 19.

In this example, upon starting the process illustrated in FIG. 6, it is assumed that the driving operation data and the data of the actual measured vehicle behavior in a target period have already been entered from the vehicle 50 into the server apparatus 1.

It is also conceivable to execute the process illustrated in FIG. 6 using the driving operation data and the data of the actual measured vehicle behavior entered in real time from the vehicle 50.

First, the CPU 11 executes the simulation using the standard vehicle model in step S101. That is, by being provided with the driving operation data entered from the vehicle 50 as the input data of the standard vehicle model described above, the CPU 11 executes the simulation of the vehicle behavior.

In step S102 following step S101, the CPU 11 calculates the degree of similarity with the actual measured vehicle behavior. That is, the CPU 11 calculates the degree of similarity Sv between the vehicle behavior obtained by the simulation executed in step S101 and the actual measured vehicle behavior.

In step S103 following step S102, the CPU 11 determines whether the degree of similarity Sv is less than or equal to a threshold THp. As it is appreciated from the foregoing description, this determination process corresponds to the process of determining the presence or absence of the abnormality in the vehicle 50.

Note that the threshold THp may be the same value as or different from the threshold THd described above.

In step S103, if the CPU 11 determines that the degree of similarity Sv is not less than or equal to the threshold THp, the CPU 11 proceeds to step S112 and executes an abnormality-free notification process. That is, as described above, the CPU 11 executes the process of notifying the notification target such as the user of the data indicating the absence of the abnormality in the vehicle 50.

The CPU 11 ends the series of processes illustrated in FIG. 6 in response to the execution of the process of step S112.

If the CPU 11 determines in step S103 that the degree of similarity Sv is less than or equal to the threshold THp, the CPU 11 proceeds to step S104 and performs a process of setting an abnormal item identifier M to "1". The abnormal item identifier M is an identifier for identifying the abnormal item to be processed out of the abnormal items M1 to Mn.

In step S105 following step S104, the CPU 11 executes the simulation using the vehicle model of the M-th abnormal item. That is, the CPU 11 executes the simulation of the vehicle behavior that is provided with, as the input data, the driving operation data entered from the vehicle 50 into the vehicle model of the M-th abnormal item.

In step S106 following step S105, the CPU 11 calculates the degree of similarity Sv with the actual measured vehicle behavior and, in the subsequent step S107, determines whether the degree of similarity Sv is greater than or equal to the threshold THd.

In step S107, if the CPU 11 determines that the degree of similarity Sv is greater than or equal to the threshold THd, the CPU 11 proceeds to step S108 and performs a process of storing the M-th abnormal item, that is, a process of causing the predetermined storage device such as the RAM 13 or the storage 19 to store data indicating the M-th abnormal item. Thereafter, the process proceeds to step S109.

If the CPU 11 determines in step S107 that the degree of similarity Sv is not greater than or equal to the threshold THd, the CPU 11 passes the storage process of step S108 and proceeds to step S109.

In step S109, the CPU 11 determines whether the abnormal item identifier M is greater than or equal to a maximal value Mmax. Here, the maximum value Mmax is "n".

In step S109, if the CPU 11 determines that the abnormal item identifier M is not greater than or equal to the maximal value Mmax (that is, when the number of abnormal items that have been processed is less than n), the CPU 11 proceeds to step S110 to increment the abnormal item identifier M by 1, and returns to step S105. In this manner, a process for the subsequent abnormal item is performed.

If the CPU 11 determines in step S109 that the abnormal item identifier M is greater than or equal to the maximal value Mmax, the CPU 11 proceeds to step S111 and executes an identified abnormal item notification process. That is, the CPU 11 executes the process for notifying the notification target such as the user of the data indicating the abnormal item stored in the storage process of the preceding step S108.

The CPU 11 ends the series of processes illustrated in FIG. 6 in response to the execution of the process of step S111.

Note that in the above description, the simulation using the vehicle model (S105), the calculation of the degree of similarity Sv (S106), and the similarity determination based on the degree of similarity Sv (S107) are executed separately for each abnormal item; however, instead of this, it is also possible to collectively execute the simulations using the multiple vehicle models to obtain the vehicle behaviors for the respective abnormal items, and thereafter perform the calculation of the degree of similarity Sv (S106) and the similarity determination based on the degree of similarity Sv (S107) for each of the vehicle behaviors.

4. Modification

The embodiment of the invention has been described above; however, the invention is not limited to the specific example described above, and various configurations may be adopted as modifications.

For example, in the above description, the example is given of performing the determination of whether the degree of similarity Sv is greater than or equal to the threshold THd, as the determination of whether the vehicle behavior obtained by the simulation using the vehicle model and the actual measured vehicle behavior satisfy the predetermined similarity condition (hereinafter, referred to as "vehicle behavior similarity determination"). However, a specific method of the vehicle behavior similarity determination is variously conceivable, and is not limited to the identifying method.

For example, the vehicle behavior similarity determination may be performed using an AI (artificial intelligence) for determination. In this case, as the AI for the determination, it is conceivable to use, based on the actual measured vehicle behavior and the vehicle behavior simulated using the vehicle model as the input data: the AI obtained by machine learning in such a manner as to output a similar/dissimilar determination result; or the AI obtained by machine learning in such a manner as to output a value indicating the degree of similarity.

Further, it has been mentioned in the above description that the identified abnormal item is notified to, for example, the user; however, it is conceivable that the simulation using the vehicle model may be performed at regular intervals, and the notification may be performed in accordance with the progress of the abnormality. For example, if it is determined that the abnormality gradually progresses based on the regular simulations, it is possible to estimate that malfunction risks are low. Accordingly, a maintenance notification is given. In contrast, if it is determined that the abnormality rapidly progresses based on the regular simulations, it is possible to estimate that malfunction risks are high. Accordingly, a repair notification is given, for example.

It is also conceivable that the simulation of the vehicle behavior using the vehicle model and the vehicle behavior similarity determination may be performed separately for each traveling mode of the vehicle 50. Examples of the traveling mode include during straight traveling of the vehicle 50 and during turning of the vehicle 50.

5. Conclusion of Embodiment

As described above, the data processing apparatus (the server apparatus 1) according to the embodiment includes one or more processors (the CPU 11), and one or more storage media (the ROM 12 or the storage 19) having a program to be executed by the one or more processors stored therein. The program includes one or more commands. The commands cause the one or more processors to execute the following processes.

That is, the processes to be executed are: a simulation process of performing, based on driving operation data of a vehicle (the vehicle 50), a simulation of a vehicle behavior using multiple vehicle models having different parameter settings; and a model identifying process of evaluating a similarity of a vehicle behavior of each of the vehicle models to be obtained in the simulation process with an actual measured vehicle behavior, the actual measured vehicle behavior being a vehicle behavior of the vehicle that has been actually measured, and identifying the vehicle model that satisfies a predetermined similarity condition.

With this configuration, the preparation of the vehicle models that reproduce the abnormal items of the vehicle as the multiple vehicle models allows the abnormal item of the vehicle to be identified by the identification of the vehicle model in the model identifying process. That is, it is possible to identify the abnormal item of the vehicle without performing an inspection work of the abnormal item.

It is therefore possible to reduce a work burden related to the identification of the abnormal item of the vehicle.

Further, according to the data processing apparatus of the embodiment, the multiple vehicle models to be used in the simulation process are vehicle models subjected to respective parameter settings corresponding to different abnormal items out of abnormal items of the vehicle.

Thus, the abnormal item of the vehicle is identified by performing the identification of the vehicle model in the model identifying process.

It is therefore possible to reduce a work burden related to identifying the abnormal item of the vehicle.

In addition, according to the data processing apparatus of the embodiment, in the simulation process, the simulation is performed using, as the multiple vehicle models, vehicle models each subjected to a parameter setting corresponding to a traveling road surface state of the vehicle estimated based on position data of the vehicle.

This makes it possible to perform the simulation of the vehicle behavior reflecting the actual traveling road surface state of the vehicle.

It is therefore possible to improve the simulation accuracy of the vehicle behavior, and to improve the identification accuracy of the abnormal item.

In addition, according to the data processing apparatus of the embodiment, in the model identifying process, the similarity is evaluated based on a time waveform of the vehicle behavior obtained in the simulation process and a time waveform of the actual measured vehicle behavior.

This allows the similarity evaluation between the simulated vehicle behavior and the actual measured vehicle behavior to be performed based on the correlation over time, rather than the temporal correlation of both behaviors.

It is therefore possible to improve accuracy of the similarity evaluation.

Further, according to the data processing apparatus of the embodiment, the one or more commands cause the one or more processors to execute: a determination process of performing a simulation of a vehicle behavior using a vehicle model subjected to a parameter setting different from the parameter settings corresponding to the abnormal items, and determining whether a degree of similarity of the vehicle behavior obtained by the simulation with respect to the actual measured vehicle behavior is less than or equal to a predetermined degree of similarity; and the model identifying process on condition that a determination result that the degree of similarity is less than or equal to the predetermined degree of similarity is obtained by the determination process.

As described above, it becomes possible to determine the presence or absence of the abnormality in the vehicle by the determination process that uses the simulation result of the vehicle model subjected to the parameter setting that differs from the parameter setting corresponding to the abnormal item as described above.

Accordingly, with this configuration, when it is determined that the vehicle is free of abnormality, the process of identifying the abnormal item based on the result of the simulation using the multiple vehicle models becomes unnecessary, which makes it possible to improve the processing efficiency.

Further, the program according to the embodiment is a program readable by a computer apparatus. The program causes the computer apparatus to execute: a simulation process of performing, based on driving operation data of a vehicle to be a target, a simulation of a vehicle behavior using multiple vehicle models having different parameter settings; and a model identifying process of evaluating a similarity of a vehicle behavior of each of the vehicle models to be obtained in the simulation process with an actual measured vehicle behavior, the actual measured vehicle behavior being a behavior of the vehicle that has been actually measured, and identifying the vehicle model that satisfies a predetermined similarity condition.

With such a program, it is possible to cause the computer apparatus to function as the data processing apparatus according to the embodiment described above.

DESCRIPTION OF REFERENCE NUMERALS 1 server apparatus
50 vehicle
NT network
11 CPU
12 ROM
13 RAM
14 bus
15 input/output interface
16 input unit
17 display
18 audio outputting unit
19 storage
20 communicator
21 drive
22 removable recording medium
51 sensor unit
51a yaw rate sensor
51b acceleration sensor
51c vehicle attitude sensor
51d GNSS sensor
51e steering wheel angle sensor
51f wheel speed sensor
52 controller
53 memory
54 communicator

The invention claimed is:

1. A data processing apparatus comprising:
one or more processors; and
one or more storage media comprising a program to be executed by the one or more processors stored therein, wherein
the program comprises one or more commands,
the one or more commands cause the one or more processors to execute:
a simulation process of performing, based on driving operation data of a vehicle of interest, a simulation of a vehicle behavior of the vehicle of interest using a plurality of vehicle models of the vehicle of interest, each of the plurality of vehicle models being subjected to a parameter setting corresponding to a different vehicle setting of the vehicle of interest; and
a model identifying process of, for each of the plurality of vehicle models,
evaluating a similarity between a time waveform of the vehicle behavior obtained in the simulation process using a corresponding one of the plurality of vehicle models and a time waveform of an actual measured vehicle behavior, the actual measured vehicle behavior being a vehicle behavior of the vehicle of interest that has been actually measured, and
identifying, from among the plurality of vehicle models, one or more of the plurality of vehicle models that satisfy a predetermined similarity condition based on the evaluated similarity.

2. The data processing apparatus according to claim 1, wherein the plurality of vehicle models to be used in the simulation process are vehicle models subjected to respective parameter settings corresponding to different abnormal items out of abnormal items of the vehicle of interest.

3. The data processing apparatus according to claim 2, wherein the one or more commands cause the one or more processors to execute:
a determination process of performing, based on the driving operation data of the vehicle of interest, a simulation of a vehicle behavior of the vehicle of interest using a vehicle model of the vehicle of interest subjected to a parameter setting different from the parameter settings corresponding to the abnormal items, and determining whether a degree of similarity of the vehicle behavior obtained by the simulation with respect to the actual measured vehicle behavior of the vehicle of interest is less than or equal to a predetermined degree of similarity; and
the model identifying process in response to determining, in the determination process, that the degree of similarity is less than or equal to the predetermined degree of similarity.

4. The data processing apparatus according to claim 1, wherein, in the simulation process, the simulation is performed using, as the plurality of vehicle models, the plurality of vehicle models each subjected to a parameter setting corresponding to a traveling road surface state of the vehicle of interest estimated based on position data of the vehicle of interest.

5. The data processing apparatus according to claim 1, wherein the vehicle setting includes at least one of:
a wheel alignment setting including an abnormality in a toe angle or an abnormality in a camber angle;
a throttle setting including an abnormality in a response speed or an abnormality in an opening and closing quantity; or
a brake pad setting.

6. The data processing apparatus according to claim 1, wherein the evaluating of the similarity comprises calculating a degree of similarity by:
calculating, using a cross-correlation function, correlation values for respective time waveforms of a yaw rate, a longitudinal acceleration, a lateral acceleration, a roll angle, and a pitch angle, each correlation value having 1 as a largest value, the respective time waveforms being included in (i) the vehicle behavior obtained in the simulation process and (ii) the actual measured vehicle behavior; and summing the correlation values, wherein the model identifying process is configured to identify the one or more of the plurality of vehicle models as the one or more of the plurality of vehicle models for which the degree of similarity is greater than or equal to a predetermined threshold.

7. A non-transitory computer readable recording medium containing a computer program, the computer program causing, when executed by a computer, the computer to execute a process comprising a simulation process of performing, based on driving operation data of a vehicle of interest, a simulation of a vehicle behavior of the vehicle of interest using a plurality of vehicle models of the vehicle of interest, each of the plurality of vehicle models being subjected to a parameter setting corresponding to a different vehicle setting of the vehicle of interest; and a model identifying process of, for each of the plurality of vehicle models, evaluating a similarity between a time waveform of the vehicle behavior obtained in the simulation process using a corresponding one of the plurality of vehicle models and a time waveform of an actual measured vehicle behavior, the actual measured vehicle behavior being a behavior of the vehicle of interest that has been actually measured, and identifying, from among the plurality of vehicle models, one or more of the plurality of vehicle models that satisfy a predetermined similarity condition based on the evaluated similarity.

* * * * *